United States Patent [19]
Somerville

[11] Patent Number: 5,627,494
[45] Date of Patent: May 6, 1997

[54] HIGH SIDE CURRENT SENSE AMPLIFIER

[75] Inventor: Thomas A. Somerville, Chandler, Ariz.

[73] Assignee: Motorola, Inc., Schaumburg, Ill.

[21] Appl. No.: 566,748

[22] Filed: Dec. 4, 1995

[51] Int. Cl.$^6$ ................................................. H03F 3/45
[52] U.S. Cl. ........................... 330/257; 330/260; 327/53; 327/54
[58] Field of Search ........................... 330/69, 105, 257, 330/260; 327/53, 54

[56] References Cited

U.S. PATENT DOCUMENTS

| | | | |
|---|---|---|---|
| 3,708,755 | 1/1973 | Ruehle | 330/105 X |
| 4,001,703 | 1/1977 | Saul et al. | 330/105 X |
| 4,521,739 | 6/1985 | Peterson | 330/260 X |
| 5,498,984 | 3/1996 | Schaffer | 327/63 X |

Primary Examiner—James B. Mullins
Attorney, Agent, or Firm—Gary W. Hoshizaki

[57] ABSTRACT

A high side current sense amplifier (21) comprises a first resistor, a second resistor, an amplifier (22), and a darlington transistor pair. The first resistor has a first input and a second input coupled to a non-inverting input of the amplifier (22). The darlington transistor pair has a collector coupled to the non-inverting input of the amplifier (22), a base coupled to an output of amplifier (22), an emitter. The second resistor is coupled between the emitter of the darlington transistor pair and ground. A differential voltage is applied across the first input of the first resistor and an inverting input of the amplifier (22). The darlington transistor pair converts an output voltage of the amplifier (22) to a feedback current for generating a voltage across the first resistor. Under stable conditions the voltage across the first resistor is equal to the differential voltage. The voltage gain is the ratio of the second resistor to the first resistor. The high side current sense amplifier (21) has excellent common mode voltage rejection and minimizes common mode error due to semiconductor wafer process variations.

8 Claims, 2 Drawing Sheets

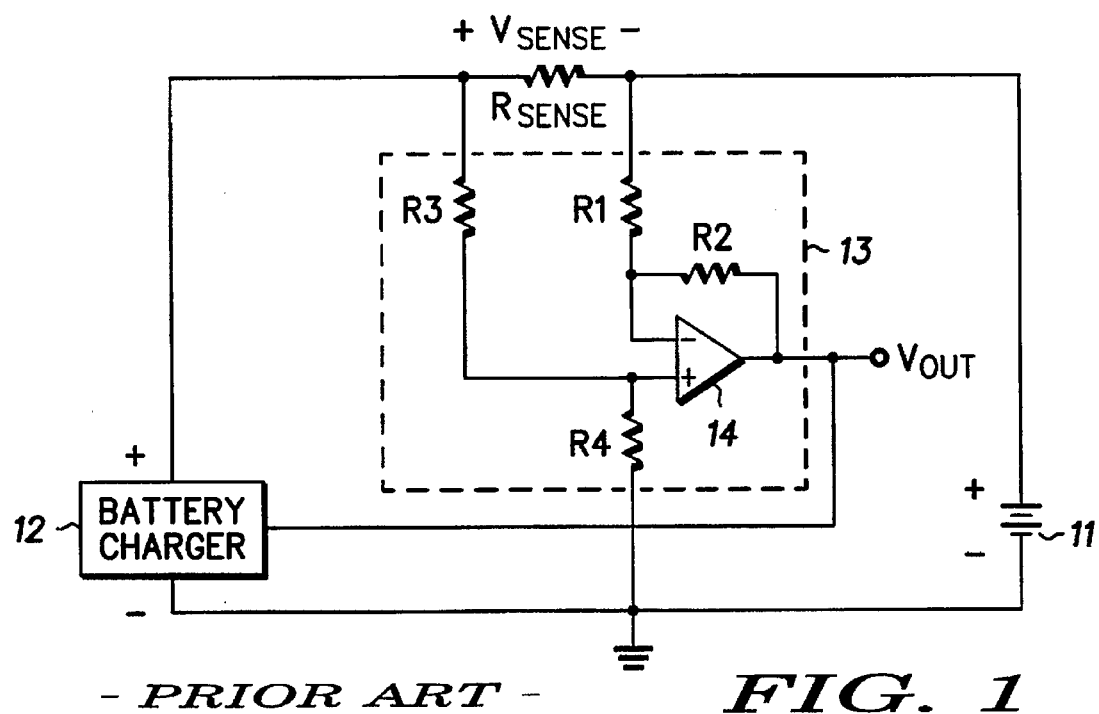
*- PRIOR ART -* FIG. 1
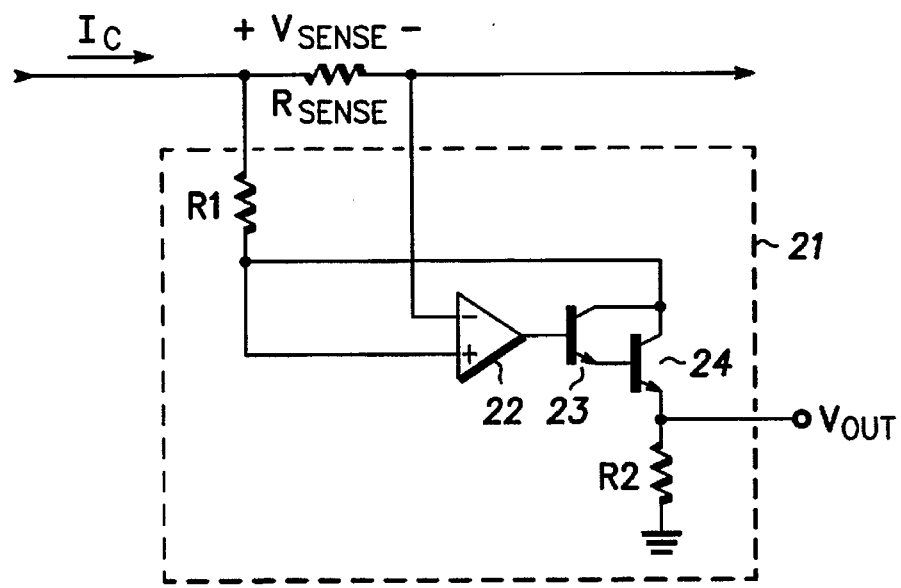
FIG. 2

2

HIGH SIDE CURRENT SENSE AMPLIFIER

BACKGROUND OF THE INVENTION

This invention relates, in general, to amplifier circuits, and more particularly, to amplifiers for amplifying a differential voltage and providing a single-ended voltage.

An increasing number of electronic circuits are powered by batteries. Cellular telephones, personal computers, and stereo systems are just a few of the devices that are made portable by the use of batteries. Battery technology is driven to provide batteries of increased power while reducing battery size and weight. Rechargeable batteries such as nickel cadmium, nickel-metal hydride, or lithium are extremely popular on devices that are frequently used.

Battery chargers must accurately control the voltage and current provided to a charging battery. Overcharging a battery can damage the battery or reduce the battery life. A precision amplifier is required in a battery charger circuit to monitor current provided to a charging battery. In general, a resistor is placed between a battery charger circuit and the battery for monitoring charging current. The voltage across the resistor corresponds to the charging current being provided to the battery. The precision amplifier amplifies the voltage across the resistor and provides a feedback signal corresponding to the charging current. The battery charger circuit is continuously adjusted to prevent overcharging based on the charging time period, magnitude of the charging current, and the battery voltage.

It would be of great benefit if an amplifier could be provided that accurately senses a differential voltage and is easily integrated on a semiconductor wafer process.

BRIEF DESCRIPTION OF THE DRAWINGS

FIG. 1 is a prior art schematic diagram of a high side current sense amplifier;

FIG. 2 is a schematic diagram of a high side current sense amplifier in accordance with the present invention.

DETAILED DESCRIPTION OF THE DRAWINGS

Figure 3:
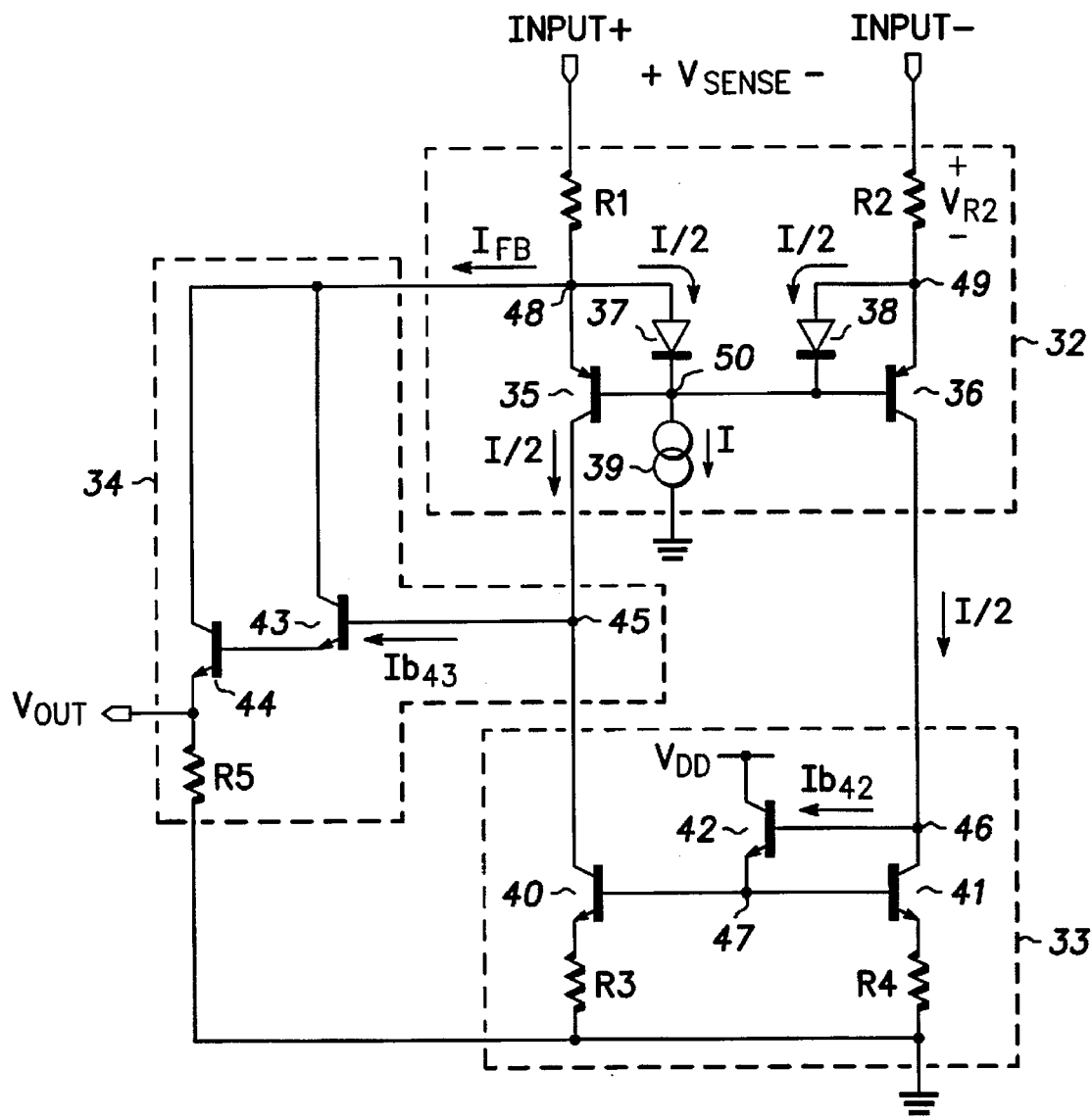
FIG. 3 is a schematic diagram of a bipolar transistor implementation of a high side current sense amplifier in accordance with the present invention.

FIG. 1 is a prior art schematic diagram of a battery 11 being charged. Battery 11 is charged by battery charger 12. A resistor Rsense is coupled between battery charger 12 and battery 11. The resistor Rsense is used to generate a voltage Vsense which corresponds to the charge current provided by battery charger 12 to battery 11. The voltage Vsense increases and decreases respectively as the charge current increases and decreases.

A high side current sense amplifier 13 comprises an amplifier 14, a resistor R1, a resistor R2, a resistor R3, and a resistor R4. The term "high side" refers to the fact that the resistor Rsense is coupled between the positive terminals of battery charger 12 and battery 11. A "low side" connection would place a sense resistor between the negative terminals of battery charger 12 and battery 11. The problem with a low side connection is the loss of a ground reference. The negative terminals of battery 11 and battery charger 12 would be at different voltages due to the voltage drop across the sense resistor as battery 11 is charged. In general, low side sensing is normally not used because of the difficulty in monitoring battery voltage and current during a battery charge sequence.

High side current sensing eliminates the problem by having ground common to both battery 11 and battery charger 12. High side current sensing does produce its own problem as the inputs of amplifier 13 are coupled to a common mode voltage approximately equal to the voltage of battery 11. Amplifier 13 is a well known amplifier configuration for amplifying a differential voltage. Amplifier 13 comprises an amplifier 14 and resistors R1, R2, R3, and R4. Amplifier 13 amplifies the differential voltage across resistor Rsense and provides a voltage at an output Vout that corresponds to the current provided to battery 11. Typically, resistor Rsense has a low resistance value (for example, less than one ohm) to minimize the voltage Vsense.

Resistor Rsense has a first terminal coupled to a positive terminal of battery charger 12 and a second terminal coupled to a positive terminal of battery 11. Resistor R1 has a first terminal coupled to the second terminal of Rsense and a second terminal coupled to an inverting input of amplifier 14. Resistor R2 is a feedback resistor having a first terminal coupled to the inverting input of amplifier 14 and a second terminal coupled to an output of amplifier 14. Resistor R3 and resistor R4 form a resistor divider circuit. Resistor R3 has a first terminal coupled to the first terminal of resistor Rsense and a second terminal coupled to a non-inverting terminal of amplifier 14. Resistor R4 has a first terminal coupled to the non-inverting input of amplifier 14 and a second terminal coupled to ground. The output of amplifier 14 couples to the output Vout and battery charger 12 for providing information on the current charging battery 11.

Ideally, only the differential voltage (voltage Vsense) is amplified by amplifier 14. In practice, resistor mismatch will produce a common mode error that corresponds to the common mode voltage at the inverting and the non-inverting inputs of amplifier 14. The amplified error can greatly affect the accuracy of the current measurement. An example best illustrates the problem of amplifying a portion of the common mode signal.

An error voltage Verror produced at the output Vout is defined by an equation 1 listed below:

$$Verror = Vcm * (R4/(R3+R4)) * (1-(R2/R1)/(R4/R3)) \qquad (1)$$

where Vcm is a common mode voltage. In the preferred embodiment, a battery charger circuit and a high side current sense amplifier are formed as an integrated circuit. It is well known that a specific resistor value is difficult to achieve on an integrated circuit process but that resistors can be accurately matched. Typically, a resistor pair is matched within one percent or better on an integrated circuit.

Placing values in equation 1 helps to illustrate the voltage error that is produced when the circuit is processed on a standard semiconductor wafer process. First, assume the amplified differential voltage of amplifier 14 is equal to 200 millivolts at output Vout. Second, a common mode voltage Vcm of 8.0 volts is produced by battery charger 12 charging battery 11. Resistors R1, R2, R3, and R4 are matched to have equal resistance. Third, R4/R3=1.0 which corresponds to an ideal match. Finally, R2/R1=1.01 which corresponds to a one percent error in resistor mismatch. The result is shown in equation 2.

$$Verror = (8 \text{ volts}) * (0.50) * (0.01) = 40 \text{ millivolts} \qquad (2)$$

In this example, the error produced by the high side current sense amplifier is 40 millivolts divided by 200 millivolts, or 20 percent error. The percent error would decrease if the amplified differential voltage is larger and conversely increase if the amplified differential voltage is smaller. Note that the 20 percent error was produced with only a one percent error in resistor mismatch. In most circuit applications, 20 percent error would be intolerable. Additional processing steps such as resistor trimming is employed to reduce voltage error due to common mode voltage at the expense of increased cost and manufacturing complexity.

FIG. 2 is a schematic diagram of a high side current sense amplifier 21 in accordance with the present invention. A current Ic generates a voltage Vsense across a resistor Rsense. The voltage Vsense is a differential voltage applied across inputs of high side current sense amplifier 21. High side current sense amplifier 21 reduces voltage error due to a common mode voltage applied to the inputs. High side current sense amplifier 21 comprises an amplifier 22, resistors R1 and R2, transistors 23 and 24.

Resistor Rsense has a first terminal for receiving current Ic and a second terminal. Amplifier 22 has a non-inverting input, an inverting input coupled to the second terminal of Rsense, and an output. Resistor R1 has a first terminal coupled to the first terminal of Rsense and a second terminal coupled to the non-inverting input of amplifier 22. Transistors 23 and 24 form a darlington transistor pair. Transistor 23 has a collector coupled to the second terminal of resistor R1, a base coupled to the output of amplifier 22, and an emitter. Transistor 24 has a collector coupled to the second terminal of resistor R1, a base coupled to the emitter of transistor 23, and an emitter coupled to an output Vout. Resistor R2 has a first terminal coupled to the emitter of transistor 24 and a second terminal coupled for receiving a power supply voltage (e.g. ground).

Amplifier 21 is configured to produce a voltage drop across resistor R1 equal to the voltage drop across Rsense. Amplifier 22 drives the darlington transistor pair (transistors 23 and 24) until the voltage at both the non-inverting and inverting inputs are equal. The darlington transistor pair is a voltage to current circuit which converts an output voltage of amplifier 22 to a feedback current that is provided to resistor R1. A Metal Oxide Semiconductor Field Effect Transistor (MOSFET) is an equivalent circuit for replacing the darlington transistor pair. In particular, a n-channel enhancement MOSFET, as a replacement for the darlington transistor pair, would have a drain coupled to the non-inverting input of amplifier 22, a gate coupled to the output of amplifier 22, and a source coupled to the first terminal of resistor R2. The n-channel enhancement MOSFET would convert the output voltage of amplifier 22 to a feedback current similar to the darlington transistor pair. The voltage at the output Vout is approximately described by equation 3.

$$Vout(voltage) = Vsense*(R2/R1) \qquad (3)$$

The common mode error of high side current sense amplifier 21 is related to the common mode rejection ratio of amplifier 22 since the common mode voltage is applied directly to the inputs of amplifier 22. Typically, an integrated amplifier has a common mode rejection ratio greater than 100 decibels. Numbers similar to that of the example described in FIG. 1 applied to high side current sense amplifier 21 will illustrate an improvement in common mode error. Assume the amplified differential voltage (Vsense) of high side current sense amplifier 21 is equal to 200 millivolts at the output Vout. A common mode voltage Vcm of 8.0 volts is provided to the inverting and non-inverting inputs of amplifier 22. The common mode rejection ratio (CMRR) of amplifier 22 is 100 decibels. The resistor ratio R2/R1 is equal to 1.01 corresponding to a resistor mismatch of one percent. The voltage error at the output Vout is described by equation 4.

$$Verror = Vcm*(CMRR)*(R2/R1) \qquad (4)$$

The voltage error using the numbers provided hereinabove is calculated in equation 5.

$$Verror = (8.0 \text{ volts})*(1.01)/(10^5) = 80.8 \text{ microvolts} \qquad (5)$$

The percent error due to an eight volt common mode voltage is 80.8 microvolts divided by 200 millivolts or 0.0404 percent error. High side current sense amplifier 21 is easily integrated on a semiconductor wafer process and reduces common mode voltage problems without expensive and time consuming wafer process steps such as resistor trimming.

FIG. 3 is a schematic diagram of a bipolar transistor implementation of a high side current sense amplifier 31 in accordance with the present invention. High side current sense amplifier 31 includes an Input+, an Input−, and an output Vout. A differential voltage Vsense is applied to the inputs Input+ and Input−. High side current sense amplifier 31 does not amplify common mode voltages applied to Input+ and Input− and produces only an insignificant common mode error voltage. In general, a voltage applied to Input+ is greater than or equal to a voltage applied to Input−.

High side current sense amplifier 31 comprises a common base input stage 32, a current mirror stage 33, and a voltage to current output stage 34. It should be noted that although high side current sense amplifier 31 is implemented using bipolar transistors each stage could be implemented equivalently using Field Effect Transistors (FETs) or a mixture of bipolar and FETs. High side current sense amplifier 31 uses current feedback to generate a voltage across a resistor R1 that is equal to the combined voltage of Vsense and a voltage across resistor R2. High side current sense amplifier comprises transistors 35, 36, 40, 41, 42, 43, and 44, diodes 37 and 38, resistors R1, R2, R3, R4, and R5, and current source 39. Transistors 35, 36, 40, 41, 42, 43, and 44 have a first electrode, a control electrode, and a second electrode respectively corresponding to a collector, a base, and an emitter. Diodes 37 and 38 have a first electrode and a second electrode respectively corresponding to an anode and a cathode.

Common base stage 32 comprises bipolar PNP transistors 35 and 36, diodes 37 and 38, resistors R1 and R2, and current source 39. Resistor R1 has a first terminal connected to Input+ and a second terminal connected to a node 48. Resistor R2 has a first terminal connected to Input− and a second terminal connected to a node 49. PNP transistor 35 has a collector connected to a node 45, a base connected to a node 50, and an emitter connected to a node 48. Diode 37 has an anode connected to node 48 and a cathode connected to node 50. Diode 38 has an anode connected to node 49 and a cathode connected to node 50. PNP transistor 36 has a collector connected to a node 46, a base connected to node 50, and an emitter connected to node 49. Current source 39 has a first terminal connected to node 50 and a second terminal connected for receiving a first power supply voltage (e.g. ground).

Transistors 35 and 36, and diodes 37 and 38 have equal conductive areas such that they conduct equal currents with equal voltage bias. In an embodiment, diodes 37 and 38 are bipolar PNP transistors having a collector and base coupled in common to form a diode which better matches the conductive areas of transistors 35 and 36. Current source 39 provides a bias current I to common base stage 32. Diodes 37 and 38 are each biased by one half (I/2) of the bias current I when the voltage at node 48 equals the voltage at node 49. Similarly, transistors 35 and 36 are respectively enabled by diodes 37 and 38 for providing a current of I/2 under quiescent conditions. A change in differential voltage Vsense applied across Input+ and Input– produces a transient current change in transistors 35 and 36.

Current mirror stage 33 comprises NPN transistors 40, 41, and 42, and resistors R3 and R4. Current mirror stage 33 mirrors the current of NPN transistor 41 to NPN transistor 40. NPN transistor 40 has a collector connected to node 45, a base connected to a node 47, and an emitter. Resistor R3 has a first terminal connected to the emitter of NPN transistor 40 and a second terminal coupled for receiving the first power supply voltage. NPN transistor 41 has a collector connected to node 46, a base connected to node 47, and an emitter. Resistor R4 has a first terminal connected to the emitter of NPN transistor 41 and a second terminal connected for receiving the first power supply voltage. NPN transistor 42 has a collector coupled for receiving a second power supply voltage (e.g. Vdd), a base connected to node 46, and an emitter connected to node 47. NPN transistors 40 and 41 have equal conductive areas. Resistors R3 and R4 are degeneration resistors for increasing the output impedance of transistors 40 and 41. NPN transistor 42 provides base current to NPN transistors 40 and 41.

Common base stage 32 and current mirror stage 33 form a voltage gain stage that amplifies a differential voltage applied across inputs Input+ and Input–. Common base stage 32 and current mirror stage 33 are full differential in design to reject common mode voltages. An amplified voltage signal is provided at node 45.

Voltage to current output stage 34 comprises NPN transistors 43 and 44 and resistor R5. Voltage to current output stage 34 provides current feedback to common base stage 32. NPN transistors 43 and 44 form a darlington transistor pair having high current gain. NPN transistor 43 has a collector connected to node 48, a base connected to node 45, and an emitter. NPN transistor 44 has a collector connected to node 48, a base connected to the emitter of NPN transistor 43, and an emitter coupled to the output Vout. Resistor R5 has a first terminal connected to the output Vout and a second terminal coupled for receiving the first power supply voltage.

High side current sense amplifier 31 utilizes current feedback to maintain a condition where nodes 48 and 49 are at an equal voltage. This corresponds to the voltage across resistor R1 being equal to the combined voltage of the differential voltage Vsense and the voltage across resistor R2. The current of PNP transistors 35 and 36 and NPN transistors 40 and 41 are approximately I/2 in this stable condition. A feedback current Ifb and the I/2 current of PNP transistor 35 combine to generate a voltage drop across resistor R1 to bring high side current sense amplifier 31 into balance.

A change in the differential voltage Vsense produces a corresponding change in the currents output by PNP transistors 35 and 36. For example, an increase in the differential voltage increases the current of PNP transistor 35 and reduces the current of PNP transistor 36. Current mirror stage 33 receives the current of PNP transistor 36 and mirrors the current such that NPN transistor 40 outputs a current of equal magnitude. The current of PNP transistor 35 is larger than the current of NPN transistor 40 thereby increasing the voltage at node 45. Voltage to current output stage 34 increases the feedback current in response to the voltage increase at node 45 thereby increasing the voltage across resistor R1. The increase in voltage across resistor R1 reduces the current output by PNP transistor 35 until the current of PNP transistors 35 and 36 are equal (balanced condition).

A base current Ib42 of NPN transistor 42 is a potential source of error since it reduces the current that is received by NPN transistor 41 of current mirror stage 33. A base current Ib43 of NPN transistor 43 of voltage to current output stage 34 reduces the current received by NPN transistor 40. Voltage error is minimized by operating NPN transistors 42 and 43 at similar currents such that Ib42 and Ib43 are approximately equal and the currents received by NPN transistors 40 and 41 are equal.

The voltage at output Vout is described by an equation 6:

$$Vout = Ifb*((\beta 43*\beta 44+1)/((\beta 43*\beta 44)))*R5 \quad (6)$$

where $\beta 43$ and $\beta 44$ are respectively the beta (current gain) of NPN transistors 43 and 44. The feedback current Ifb is described by an equation 7 shown below.

$$Ifb = (Vsense/R1) + I*(R2/R1-1) \quad (7)$$

The current I is the current of current source 39. Combining equations 6 and 7 yields an expression for the voltage at Vout as shown in equation 8.

$$Vout = (Vsense/R1 + I*(R2/R1-1))*R5*((\beta 43*\beta 44)+1)/(\beta 43*\beta 44)) \quad (8)$$

For example, if R2/R1=R5/R1=1.0, and, $\beta 43$ and $\beta 44$ are >>1.0, then equation 8 can be approximated by equation 9.

$$Vout = Vsense \quad (9)$$

The ability of high side current sense amplifier 31 to reject common mode signals is not a function of resistor mismatch as described in the prior art high side current sense amplifier 13 of FIG. 1. Resistor mismatch error is not amplified to produce a larger error but is proportional to the percent mismatch. For example, in equation 8, a one percent error in the R2/R1 ratio produces approximately a one percent error in the output voltage. A common mode voltage is not amplified by high side current sense amplifier 31 due to the differential gain construction comprising common base stage 32 and current mirror stage 33. The common mode rejection ratio (CMRR) of high side current sense amplifier 31 is a ratio of the differential gain and the common mode gain. The CMRR of high side current sense amplifier 31 is described in equation 10:

$$CMRR = Vev*(1+Vout/Vt)*(\beta 43*\beta 44)/(I*R1+Vt) \quad (10)$$

where Vev is the early voltage of transistor 44, Vt is the thermal voltage (kt/q) of a transistor, $\beta 43$ is the current gain of transistor 43, $\beta 44$ is the current gain of transistor 44, and I is the current of current source 39. The CMRR is approximately described by equation 11.

$$CMRR = Vev*Vout*\beta 43*\beta 44/(Vt*I*R1) \quad (11)$$

For example, if I*R1=Vout, equation 11 reduces to CMRR= Vev*$\beta 43$*$\beta 44$/Vt. A semiconductor wafer process having the values, $Vt=26$ millivolts, $Vev=138$ volts, and $\beta 43=\beta 44=86$ calculates to a CMRR of 152 decibels using the aforementioned equation for CMRR. The common mode voltage error for an 8 volt common mode voltage with a CMRR of 152 decibels is 0.21 microvolts. The percent error is approximately 0.0001 percent when $Vout=200$ millivolts. Thus, high side sense amplifier 31 substantially reduces the voltage error produced by a common mode voltage. High side sense amplifier 31 does nor require special wafer processing steps that increase cost and manufacturing time.

By now it should be appreciated that a high side current sense amplifier has been provided that reduces common mode voltage error. The high side sense amplifier includes a full differential common base stage and current mirror stage for producing a voltage gain and rejecting common mode signals applied to a differential input. A voltage to current stage provides current feedback to stabilize operation of the high side sense amplifier and fixes the voltage gain of the high side current sense amplifier.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

I claim:

1. A high side current sense amplifier having a first input, a second input, and an output for amplifying a differential voltage comprising:

a common base stage having a first input and a second input coupled respectively to the first and second input of the high side current sense amplifier, a third input, a first output, and a second output wherein said common base stage comprises:

a first resistor having a first terminal and a second terminal coupled respectively to said first input and said third input of said common base stage;

a second resistor having a first terminal coupled to said second input of said common base stage and a second terminal;

a first transistor having a first electrode coupled to said first output of said common base stage, a control electrode, and a second electrode coupled to said third input of said common base stage;

a first diode having a first electrode coupled to said third input of said common base stage and a second electrode coupled to said control electrode of said first transistor;

a second transistor having a first electrode coupled to said second output of said common base stage, a control electrode coupled to said control electrode of said first transistor, and a second electrode coupled to said second terminal of said second resistor;

a second diode having a first electrode coupled to said second electrode of said second transistor and a second electrode coupled said control electrode of said first transistor;

a current source having a first terminal coupled to said control electrode of said first transistor and a second terminal coupled to a first power supply terminal for receiving a first power supply voltage;

a current mirror stage having a first terminal and a second terminal coupled respectively to said first and second outputs of said common base stage; and a voltage to current stage for providing a feedback current to said common base stage, said voltage to current circuit having an input coupled to said first terminal of said current mirror stage, a first output coupled to said third input of said common base stage, and a second output coupled to the output of the high side current sense amplifier.

2. The high side current sense amplifier as recited in claim 1 wherein said first transistor, said second transistor, said first diode, and said second diode of said common base stage have equal conductive areas for conducting equal currents under equal voltage bias conditions.

3. The high side current sense amplifier as recited in claim 1 wherein said current mirror circuit comprises:

a first transistor having a first electrode coupled to said first terminal of said current mirror stage, a control electrode, and a second electrode coupled to a first power supply terminal for receiving a first power supply voltage;

a second transistor having a first electrode coupled to said second terminal of said current mirror stage, a control electrode coupled to said control electrode of said first transistor, and a second electrode coupled to said first power supply terminal; and a third transistor having a first electrode coupled to a second power supply terminal for receiving a second power supply voltage, a control electrode coupled to said second terminal of said current mirror stage, and a second electrode coupled to said control electrode of said first transistor.

4. The high side current sense amplifier as recited in claim 3 wherein said current mirror stage further includes:

a first resistor coupled between said second electrode of said first transistor and said first power supply terminal; and a second resistor coupled between said second electrode of said second transistor and said first power supply terminal.

5. The high side current sense amplifier as recited in claim 4 wherein said first and second transistors of said current mirror stage have equal conductive area for conducting equal current under equal voltage bias.

6. The high side current sense amplifier as recited in claim 1 wherein said voltage to current stage comprises a first transistor having a first electrode, a control electrode, and a second electrode, respectively coupled to said first output, said input, and said second output of said voltage to current stage.

7. The high side current sense amplifier as recited in claim 6 further including a resistor having a first terminal coupled to said second output of said voltage to current stage and a second terminal coupled to a power supply terminal for receiving a power supply voltage.

8. The high side current sense amplifier as recited in claim 7 further including a second transistor having a first electrode coupled to said first output of said voltage to current stage, a control electrode coupled to said second electrode of said first transistor, and a second electrode coupled to said second output of said voltage to current stage, said first and second transistors of said voltage to current stage forming a darlington transistor pair.

\* \* \* \* \*